US009541591B2

(12) United States Patent
Darbinyan et al.

(10) Patent No.: US 9,541,591 B2
(45) Date of Patent: Jan. 10, 2017

(54) PERIODIC SIGNAL MEASUREMENT USING STATISTICAL SAMPLING

(71) Applicant: Synopsys, Inc., Mountain View, CA (US)

(72) Inventors: Karen Darbinyan, Pleasanton, CA (US); Yervant Zorian, Santa Clara, CA (US); Arun Kumar, Santa Clara, CA (US); Mher Mkhoyan, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 14/822,649

(22) Filed: Aug. 10, 2015

(65) Prior Publication Data

US 2016/0041212 A1 Feb. 11, 2016

Related U.S. Application Data

(60) Provisional application No. 62/036,002, filed on Aug. 11, 2014.

(51) Int. Cl.
*G01R 29/027* (2006.01)
*G01R 23/02* (2006.01)

(52) U.S. Cl.
CPC ........... *G01R 29/0273* (2013.01); *G01R 23/02* (2013.01)

(58) Field of Classification Search
CPC ............................ G01R 23/02; G01R 29/0273

USPC ............................................. 327/33; 365/201
See application file for complete search history.

(56) References Cited

U.S. PATENT DOCUMENTS

| | | | | |
|---|---|---|---|---|
| 4,468,614 A | * | 8/1984 | Takahashi | G01R 23/10 324/76.15 |
| 2005/0270940 A1 | * | 12/2005 | Yen | H03M 1/109 369/53.1 |
| 2009/0102514 A1 | | 4/2009 | Hsu | |

* cited by examiner

*Primary Examiner* — William Hernandez
(74) *Attorney, Agent, or Firm* — Bever, Hoffman & Harms, LLP (57) ABSTRACT

A fully-digital probabilistic measurement methodology in which a periodic signal generated on an IC device is sampled multiple times during a test period, with the asserted/de-asserted state of the periodic signal determined during each sampling event. A statistically significant number of sampling events are executed according to a reference signal frequency that is uncorrelated to the IC's system clock, whereby each successive sampling event involves detecting an essentially random associated phase of the periodic signal such that the probability of detecting an asserted state during any given sampling event is proportional to the duty cycle of the periodic signal. A first count value records the number of sampling events in which the periodic signal is asserted, and a second count value records the total number of sampling events performed, whereby a ratio of these two count values provides a statistical measurement of the periodic signal's duty cycle.

19 Claims, 8 Drawing Sheets

FIG. 8(A) CLK$_{MEM}$
FIG. 8(B) clkdiv2
FIG. 8(C) Q[n]
FIG. 8(D) PS$_{Tcq}$

PERIODIC SIGNAL MEASUREMENT USING STATISTICAL SAMPLING

RELATED APPLICATIONS

This application claims priority from U.S. Provisional Patent Application 62/036,002, entitled "MEMORY ACCESS TIME MEASUREMENT BASED ON STATISTICAL SAMPLING METHOD", which was filed on Aug. 11, 2014, and is incorporated by reference herein.

FIELD OF THE INVENTION

This invention relates to integrated circuit (IC) devices, to tools and methods for testing and developing IC devices, and to on-chip circuits for measuring signals generated on IC devices such as SoC devices.

BACKGROUND OF THE INVENTION

A system on chip (SoC) is a type of integrated circuit (IC) device that integrates all components of a computer or other electronic system into a single chip. An SoC may contain digital, analog, mixed-signal, and often radio-frequency functional circuitry, all fabricated on a single chip substrate. Each SoC typically includes one or more phase-locked loop (PLL) circuits to generate clock signals used to synchronize operations and communications of the various functional circuits. In addition, each SoC typically includes from one to thousands of "embedded" memory circuits that store data utilized by the system's functional circuits. Processors and microcontrollers are examples of two other types of IC devices that include PLLs and embedded memory.

It is important to make sure that certain signals (e.g., data read from embedded memory, the clock signals generated by PLLs, etc.) are generated according to specifications in order to ensure reliable operation of an SoC (or other IC) device. Embedded memory performance is one of the critical characteristics affecting overall reliability of an SoC/IC device. Especially in the adaptive systems or automotive chips, it is important to make sure embedded memory is performing per specifications under the changing conditions of voltage and temperature. Embedded memory access time which is the delay from memory clock to the output data during memory read operation is an important parameter that determines the performance of memory and it always was a difficult task to accurately characterize it since the actual delays of high performance memories usually are within only few hundreds of picoseconds range. Prior art on measuring memory delay is based on using delay cells and applying extensive calibration to achieve acceptable accuracy.

What is needed is a simple, reliable and cost-effective test circuit and method for accurately measuring and analyzing operating characteristics of embedded memory and periodic signals generated on an SoC (or other IC) devices that avoids the problems associated with conventional approaches.

SUMMARY OF THE INVENTION

The present invention is directed to a fully digital methodology suitable for on-chip analysis of a host integrated circuit (IC) device that utilizes a probabilistic (statistics-based) signal measurement technique to accurately measure periodic signals generated, e.g., by the functional circuitry and/or embedded memory circuitry of the host IC device. The statistical signal measurement technique generally involves performing multiple sampling events during a predetermined test period, where each sampling event includes determining the substantially instantaneous asserted/de-asserted state of the periodic signal at sample times determined by a sample timing schedule, generating a detection (first) count value indicating the number of sampling events during the test period in which the periodic signal was asserted (e.g., having a high voltage), generating an event (second) count value indicating the total number of sampling events performed during the test period, and then utilizing the two count values to determine, e.g., the duty cycle of the measured periodic signal. Because the methodology only utilizes digital signal processing techniques to sample the periodic signal during each sampling event, the statistical signal measurement methodology of the present invention is fully-digital, and thus provides a significant improvement over conventional approaches that use delay cells by eliminating the need for extensive calibration.

According to an aspect of the invention, the sample timing schedule is determined by detecting a recurring "trigger" signal feature (e.g., the rising or falling edge) of a reference signal having a reference frequency that is uncorrelated to the frequency of the measured periodic signal. That is, each sample event occurs when a corresponding trigger signal feature is detected, and the time between each detected trigger signal feature determines the time between successive sampling events (i.e., the sample timing schedule). By generating the reference signal such that the reference frequency is uncorrelated to the measured periodic signal, the recurring signal features that trigger (initiate) the sampling events are detected at sample times that correspond to essentially randomly occurring phases of the periodic signal, whereby each sampling event involves detecting the asserted/de-asserted state of the periodic signal at an essentially random phase. That is, because each sampling event is performed upon detection of a signal feature (e.g., rising or falling edge) of the reference signal, and because the reference frequency is uncorrelated to the periodic signal, each recurring signal feature coincides with an essentially randomly occurring phase of the periodic signal, whereby the probability of detecting an asserted state during any given sampling event is proportional to the duty cycle of the periodic signal.

According to another aspect of the invention, a statistically significant number of sampling events are performed during each test period such that the ratio of the detection (first) count value to the total number of sampling events provides statistically relevant measurement value of the duty cycle of the periodic signal. That is, by recording the number of sampling events in which the periodic signal was asserted during the test period, and by recording the total number of sampling events performed during the test period, the ratio of these two numbers corresponds to the duty cycle of the periodic signal. Because each sampling event involves detecting the asserted/de-asserted state of an associated randomly selected/assigned phase of the periodic signal, the statistics-based measurement methodology of the present invention utilizes probability theory to generate accurate results, like flipping a coin, a fairly large number of sampling events must be performed before the count value ratio provides a statistically significant measurement value of the pulse signal's duty cycle. In one embodiment, performing a statistically significant number of sampling events involves performing approximately one million or more sampling events during each test period, which is believed to generate count value ratios that are statistically relevant (i.e., statistically significant and usably accurate, e.g., having an accuracy of +/−1% of the actual periodic signal's duty cycle).

Although one million sampling events may seem to be a large number, such a statistically significant number of sampling events can take much less than one second to perform at today's processing speeds (i.e., using a reference signal operating at 1 GHz, one million sample measurements are collected in one millisecond). In a preferred embodiment, the statistics-based measurement methodology of the present invention generates measurement results having picoseconds accuracy and resolution (i.e., greater than 99.99% using a larger number (e.g., greater than one billion) of sampling events during each test period, which can be performed in one second or less.

Combining the concepts set forth above, the statistics-based measurement approach of the present invention set forth herein may be summarized as utilizing an uncorrelated reference signal in order to sample the asserted/de-asserted state at random phases of a periodic signal such that probability of detecting an asserted state during any given sampling event is proportional to the duty cycle of the periodic signal, and performing a large (statistically significant) number of such samples to generate a statistically relevant number of detected asserted states divided by the statistically significant number of samples generates a ratio that provide an accurate measurement value of the periodic signal's duty cycle.

In one embodiment, the reference signal is further generated such that its frequency freely floats (i.e., its operating frequency is unconstrained such that it increases and decreases over time, e.g., in a range of +/−10%, in accordance with changes in device environmental conditions). Not only does the floating reference frequency have no significant effect on measurement results, this feature facilitates the use of low-cost ring oscillators as reference generators, which are known to generate output frequencies that increase and decrease in accordance with changes to device temperature.

According to another beneficial aspect, because the measurement data is generated by sampling randomly occurring periodic signal phases, the statistics-based measurement methodology of the present invention generates accurate measurement data whether the reference signal frequency is higher than the measured periodic signal frequency, or whether the reference signal frequency is lower than the measured periodic signal frequency. That is, because the sample timing is uncorrelated to the periodic signal such each sampling event involves detecting a randomly selected/assigned phase, and because the final measurement data is determined by a ratio of detected asserted states to total sampling events, the statistics-based measurement methodology produces essentially identical measurement results whether the reference signal frequency is higher or lower than the measured periodic signal frequency. Accordingly, unlike conventional measurement approaches that require a higher frequency reference signal than that of the the measured periodic signal, the reference signal frequency utilized by the present invention is entirely independent from the periodic signal frequency, which means that a single reference signal generator (e.g., a 1 GHz ring oscillator) can be utilized to measure multiple periodic signals having a wide range of periodic signal frequencies (e.g., 0.5 GHz, 5 GHz or 50 GHz). This provides an additional advantage over conventional approaches because a single periodic signal measurement circuit definition can be implemented in a wide range of different IC devices having different operating speeds.

According to an embodiment of the present invention, an on-chip periodic signal measurement circuit is fabricated on the semiconductor "chip" (e.g., silicon substrate) of a host IC device, and implements the statistical signal measurement methodology mentioned above to analyze one or more periodic signals generated in accordance with operations of functional and embedded memory circuitry of the host IC device. The periodic signal measurement circuit generally includes an on-chip reference signal generator configured to generate a reference signal, a sampling circuit configured to sample the periodic signal during each sampling event triggered by the reference signal, a detection counter coupled to the sampling circuit and configured to generate the detection (first) count value, a sampling event counter configured to generate the total event (second) count value, and a control circuit configured to coordinate the various circuits during operation. In one embodiment, the reference signal generator comprises a ring oscillator or another similar signal generating circuit that is configured using known techniques such that an oscillating reference signal generated at its output terminal has a reference frequency that floats (i.e., increases and decreases in a substantially random manner) during the test period, for example, in accordance with environmental changes (e.g., device temperature). The sampling circuit is configured to detecting one or more recurring signal features of the reference signal such that timing of the sampling events is determined by detection of a recurring signal feature of the reference signal. In an exemplary embodiment, an edge detector is utilized to detect the recurring rising edges of the reference signal, where each detected edge "triggers" an associated sampling event. The sampling circuit also generates an output (e.g., pulse) signal that causes the detection counter to incrementally increase the detection count value after each sampling event in which the periodic signal was asserted (e.g., high), and causes the detection counter to maintain (i.e., not change) the detection count value after each sampling event occurring when the periodic signal is de-asserted (e.g., low). In an exemplary embodiment, the detection and sampling event counters are implemented using standard counter circuits configured to increment in response to signals output from the sampling circuit and the reference signal generator, respectively. The control circuit coordinates measurement operations by way of resetting the counters with initial count values at the beginning of each test period, and causes the counters to output their generated count values after a statistically significant number of sampling events are performed during a given test period, whereby the count values generated at an end of each test period provide statistically significant data that can be used to calculate accurate measurements defining absolute operating characteristics (e.g., duty cycle or pulse width) of the periodic signal. In one embodiment, the control circuit is optionally configured to perform one or more additional analysis functions such as storing the final count values at the end of each test period, calculating selected measurement data (e.g., duty cycle or pulse width values), outputting measurement and/or calculated data values, and controlling a periodic signal selector circuit to facilitate testing more than one periodic signal during separate test periods. Accordingly, the periodic signal measurement circuit is easily and cost-effectively implemented onto a host IC device because utilizes a relatively small number of standard digital circuit structures (e.g., edge detectors, counters and signal control circuits) that require very little silicon space and are produced using the same process flow utilized to produce functional and memory circuitry of the host IC device. Moreover, the periodic signal measurement circuit is easily configured to facilitate a wide range of on-chip statistical signal measurement and testing/ verification of various periodic signals utilized during normal operation of the host IC device (e.g., PLL clock frequency verification and jitter evaluation, embedded memory delay measurement, interface serdes IP eye width opening measurement process monitoring, manufacturing process corner evaluation, and process variation evaluation). In addition, by providing both the reference signal generator and suitable control circuitry "on-chip" (i.e., as opposed to requiring externally supplied signals to perform statistical signal measurements), the periodic signal measurement circuit also facilitates post-production periodic self-test procedures that may be used to detect impending circuit failure by way of periodically measuring and recording critical signals that indicate potential problems by way of changes over time.

According to an exemplary specific embodiment, a periodic signal measurement circuit is configured to facilitate on-chip measurement of pulse width (duty cycle) of one or more PLL clock signals (i.e., the output signals generated by one or more phase-locked loop (PLL) circuits utilized by an IC device). In this embodiment, the sampling circuit includes an edge detector that triggers sampling events in accordance with the reference signal in a manner similar to that described above. In addition, the control circuit includes a calculator that calculates the duty cycle of the PLL clock signal by dividing the first and second count values.

According to another embodiment of the present invention, another measurement method is provided for measuring clock-to-output memory access delay times (i.e., the delay between the starting edge of the memory read operation to the memory read data output) exhibited by an embedded memory circuit on a SoC or other IC device in order to verify that the actual memory access delay time meets predetermined timing requirements (i.e., to verify that the embedded memory circuit operates at a required speed on a fabricated IC device). The methodology generally involves controlling (e.g., using a memory BIST processor) the embedded memory circuit to generate a repetitive pulse signal by initializing the memory with alternating data and constantly reading out the data, thus generating alternating "1" and "0" data bit values on the memory output terminals, generating a data time delay pulse signal by, e.g., exclusive-ORing the repetitive pulse signal and the system clock signal, measuring a pulse width of the generated clock-to-output pulse signal such that the measured pulse width of the generated clock-to-output pulse signal indicates the clock-to-output delay time of the memory read operation. In one embodiment, measuring the pulse width of the generated clock-to-output pulse signal is performed using the the statistics-based measurement methodology described above (e.g., generating count values by sampling the data time delay pulse signal according to a sample timing set by an uncorrelated reference signal, and calculating (computing) the data delay time from memory clock to memory output value using, e.g., a ratio of the two count values.

According to alternative embodiments, the embedded memory circuit is controlled to generate the repetitive pulse signal by initializing the embedded memory circuit with a stored data pattern that, when read out from the memory circuit, generates continuous transitioning on the memory output terminals between logical "0" and logical "1" during entire test (measurement) period, or by storing logical "0" and logical "1" bits in two or more selected memory locations and then controlling the memory circuit to repeatedly alternately address/read these two or more memory locations during the test period.

According to another embodiment, in order to generate a periodic signal whose duty cycle reflects the clock-to-output data delay time value, the repetitive pulse signal and the system clock signal are logically processed in a way that produce a data time delay pulse signal. In an exemplary specific embodiment, the repetitive pulse signal and the system clock signal divided by two are applied to input terminals of an exclusive-OR (XOR) logic gate, and the data time delay pulse signal is generated at the XOR output terminal. The data time delay pulse signal is then measured using the statistical signal measurement methodology of the present invention. The two resulting count values generated by the detection and event counters provide a statistical measurement of the data delay time from memory clock to memory output. That is, the exact pulse width of the data delay time from memory clock to memory output value is calculated based on correlation of the two counter values and the frequency of the pulse. For example, the exact pulse width is calculated multiplying the first count value with the system clock signal period, dividing by the second count value, and then adding a clock divider flop delay time (i.e., the delay value of the clock divider flip-flop obtained from a standard cells library characterization number, or an actual clock divider flip-flop delay value measured on-chip after fabrication). By utilizing this modified methodology, the present invention facilitates on-chip fully-digital measurement of data delay times from memory clock to memory output without requiring the extensive calibration needed with conventional approaches.

According to another embodiment of the present invention, an IC device includes functional circuitry having a device processor that communicates with a periodic signal measurement circuit by way of a bus to facilitate multiple periodic signal measurements and associated analyses. In one operating mode the device processor configures and controls an embedded memory circuit by way of an SMS wrapper circuit to generate repetitive "1" and "0" output values in order to facilitate memory clock-to-output delay measurements by the periodic signal measurement circuit using the methodology discussed above. In another operating mode, the device processor coordinates with the periodic signal measurement circuit to analyze a clock signal generated by one or more PLL circuits. The IC device also includes communication circuitry (e.g., and SMS server and I/O circuitry and associated communication busses) configured to facilitate communicating with off-chip test equipment.

BRIEF DESCRIPTION OF THE DRAWINGS

These and other features, aspects and advantages of the present invention will become better understood with regard to the following description, appended claims, and accompanying drawings, where:

FIGS. 8(A), 8(B), 8(C) and 8(D) are timing diagrams indicating various signals generated by the periodic signal measurement circuit of FIG. 7 according to a second exemplary embodiment of the present invention.

DETAILED DESCRIPTION OF THE DRAWINGS

The present invention relates to an improvement in circuits and methods for testing, deployment, characterization, and calibration of embedded memories. The following description is presented to enable one of ordinary skill in the art to make and use the invention as provided in the context of a particular application and its requirements. The terms "coupled" and "connected", which are utilized herein, are defined as follows. The term "connected" is used to describe a direct connection between two circuit elements, for example, by way of a metal line formed in accordance with normal integrated circuit fabrication techniques. In contrast, the term "coupled" is used to describe either a direct connection or an indirect connection between two circuit elements. For example, two coupled elements may be directly connected by way of a metal line, or indirectly connected by way of an intervening circuit element (e.g., a capacitor, resistor, inductor, or by way of the source/drain terminals of a transistor). Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
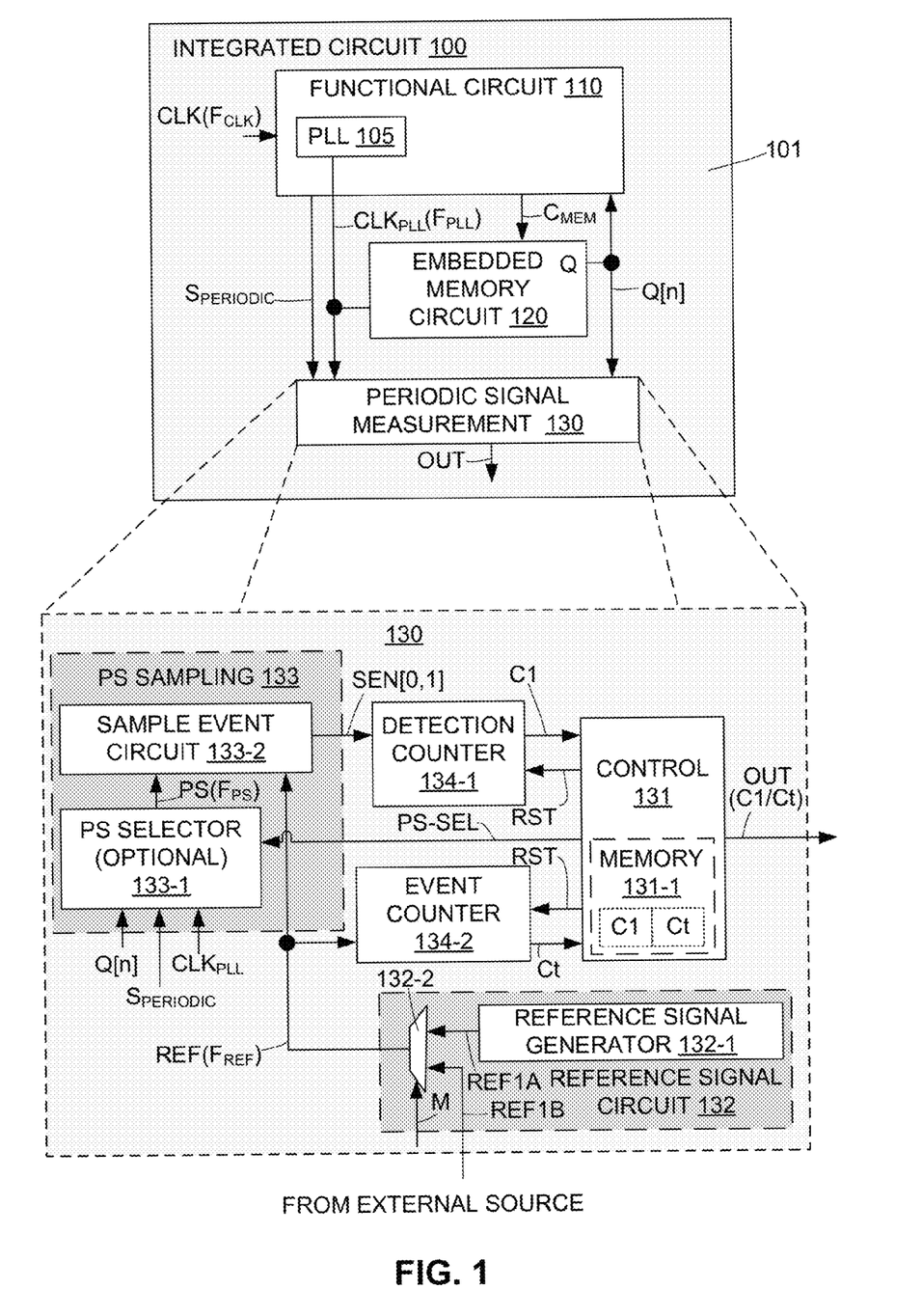
FIG. 1 is a simplified diagram showing an IC device including a periodic signal measurement circuit according to a generalized embodiment of the present invention.

FIG. 1 is a simplified diagram showing an IC device 100 including a periodic signal measurement circuit 130 according to a generalized exemplary embodiment of the present invention.

IC device 100 (e.g., an SoC device) includes at a functional circuit 110 and an embedded memory circuit 120 fabricated on a semiconductor substrate ("chip") 101, where functional circuit 110 and embedded memory circuit 120 are configured to operate in accordance with a system clock signal CLK having a system clock frequency $F_{CLK}$. Functional circuit 110 includes one or more phase-locked loop (PLL) circuits that generate PLL clock signals $CLK_{PLL}$ having associated frequencies $F_{PLL}$ that are correlated to system clock frequency $F_{CLK}$, and at least one of digital, analog, mixed-signal, or radio-frequency functional circuitry that generates one or more additional periodic signals $S_{PERIODIC}$. Embedded memory circuit 120 operates in accordance with an applied memory read clock signal (e.g., PLL clock signal $CLK_{PLL}$) and is controlled by way of memory read command signals $C_{MEM}$ generated by functional circuit 110 to read data stored therein and to transmit the read data by way of output terminals Q (one shown) such that the read data can be utilized by functional circuit 110 using well-known techniques.

As indicated in FIG. 1, periodic signal measurement circuit 130 is an "on-chip" test device in that it is also fabricated on semiconductor substrate 101, and is configured to analyze one or more periodic signals generated during operation of IC device 100 in the manner set forth below, and to generate output information OUT including raw or processed data associated with the applied analysis. As indicated at the lower portion of FIG. 1, measurement circuit 130 generally includes a control circuit 131, a reference signal circuit 132, a periodic signal (PS) sampling circuit 133, a detection counter 134-1, and a sampling event counter 134-2. Each of these sub-circuits is described in additional detail in the following paragraphs, and additional details and optional configurations are provided in the specific embodiments described further below.

Referring to the right side of FIG. 1, control circuit 131 includes a process or other control circuitry that is configured to coordinate operations of the various other sub-circuits in order to facilitate the periodic signal measurements detailed below. In one embodiment, control circuit 131 generates a reset signal RST that is transmitted to detection counter 134-1 and event counter 134-2 at the beginning of each test period, and includes a memory 131-1 configured to receive and store count values (e.g., binary numbers) C1 and Ct, which are respectively generated by detection counter 134-1 and event counter 134-2 during a given test period and transmitted to memory 131-1 at the end of the test period. In one embodiment, control circuit transmits count values C1 and Ct in output signal OUT to an external system (e.g., test equipment). In other embodiments, control circuit transmits count values C1 and Ct to an on-chip calculation circuit for calculation of, for example, duty cycle or pulse width values.

Reference signal circuit 132 functions to generate or otherwise provide a reference signal REF that is utilized by sampling circuit 133 to control the timing of sampling events in the manner described below. In particular, reference signal REF is generated as a repetitive signal such that "trigger" signal features (e.g., a rising edge or a falling edge) occur each cycle (period) of reference signal REF. As set forth below, sampling circuit detects each occurrence of this recurring "trigger" signal feature, and performs one sampling event for each detected signal feature. Thus, the timing of sampling events (i.e., the sample timing schedule) is determined by the recurring signal feature(s) of reference signal REF.

According to an aspect of the present invention, reference signal REF is generated in a manner such that its reference frequency $F_{REF}$ is uncorrelated to periodic signal PS. That is, reference signal REF is generated by a signal source (reference signal generator) that operates entirely independently from the source of system clock signal CLK. Because periodic signal PS is generated in accordance with operations of at least one of functional circuit 110 and embedded memory circuit 120, and because functional circuit 110 and embedded memory circuit 120 operate in accordance with system clock signal CLK, periodic signal PS is correlated to system clock signal CLK. By generating reference signal REF such that reference frequency $F_{REF}$ is uncorrelated to system clock signal CLK, reference frequency $F_{REF}$ is made uncorrelated to periodic signal PS. In one embodiment, reference signal REF is generated such that reference frequency $F_{REF}$ floats (e.g., increases and decreases in a manner controlled solely by substantially random factors, such as changes in local device temperatures or other environmental conditions) during each test period. In one specific embodiment, the floating of reference frequency $F_{REF}$ involves frequency changes in a range of +/−2%.

Referring again to FIG. 1, reference signal circuit 132 includes an on-chip reference signal generator 132-1, which is configured to generate an on-chip-generated reference signal REF1A, and an optional switch (multiplexer) 132-2 that is controlled by a mode signal M to transmit either on-chip-generated reference signal REF1A or an externally supplied reference signal REF1B to sampling circuit 133. In a presently preferred embodiment, reference signal generator 132-1 is implemented by a ring oscillator that is configured using known techniques such that reference signal REF1A is generated at its output terminal and has a reference frequency $F_{REF}$ that floats in accordance with device temperature changes. In other embodiments, reference signal generator 132-1 is implemented using other known circuits capable of generating reference signal REF such that reference frequency $F_{REF}$ is uncorrelated to periodic signal PS, and optionally changes/floats. As described in additional detail below, the benefit of generating reference signal REF such that its frequency is uncorrelated to the measured periodic signal and floats or otherwise changes over time is that this causes the "trigger" signal feature of reference frequency $F_{REF}$ to coincide in time with random phases of periodic signal PS.

Referring to the lower left portion of FIG. 1, sampling circuit 133 includes an optional PS selector circuit 133-1 and a sampling event circuit 131-2 that are configured to perform multiple sampling events on a selected periodic signal PS during a test period according the operation detailed below.

As indicated in FIG. 1, optional PS selector circuit 133-1 receives "raw" periodic signals (e.g., Q[n], $S_{PERIODIC}$ or $C_{LKPLL}$) from functional circuitry 110 or embedded memory circuitry 120, and serves either to selectively pass one of these "raw" periodic signals to sampling event circuit 133-2, or to process one or more of these "raw" periodic signals before passing the processed periodic signal to sampling event circuit 133-2. In one embodiment, one or more "raw" periodic signals is selected in accordance with an associated selection control signal PS-SEL generated by control circuit 131. In some embodiments, optional PS selector circuit 133-1 includes logic or other circuitry (not shown) configured to process one or more "raw" periodic signals. In any event, optional PS selector circuit 133-1 passes periodic signal PS to sampling event circuit 133-2 for measurement, where periodic signal PS is generated in accordance with operations of functional circuitry 110 or embedded memory circuit 120 and has an associated frequency $F_{PS}$ correlated to system clock signal frequency $F_{CLK}$.

Sampling event circuit 133-2 is configured to measure periodic signal PS by performing sequential sampling events during a predetermined test period according to a sample timing schedule determined by reference signal REF, wherein each sampling event involves determining the substantially instantaneous asserted/de-asserted state of periodic signal PS at a sample time determined (i.e., initiated or "triggered") by a corresponding signal feature (e.g., a rising or falling edge) of reference signal REF. That is, sampling event circuit 133-2 monitors reference signal REF and, upon detecting the occurrence of a "trigger" signal feature, samples the asserted/de-asserted state of periodic signal PS at a signal phase coinciding in time with the detected the occurrence of a "trigger" signal feature. Sampling event circuit 133-2 is configured to generate a detection signal SEN having a binary value (i.e., either "0" or "1") determined in accordance with the detected asserted/de-asserted state of periodic signal PS during each sampling event. In the preferred embodiment, detection signal SEN includes the binary value "1" for each sampling event involving the detection of an asserted periodic signal state, and includes the binary value "0" for each sampling event involving the detection of a de-asserted periodic signal state. In one embodiment, sampling event circuit 133-2 is implemented using an edge detector that generates a "1" output upon detecting the trigger signal feature when the periodic signal is asserted, and generates a "0" output at all other times.

Detection count 134-1 and sampling event counter 134-2 are separate counter circuits that respectively generate associated count values C1 and Ct during each test period, where (first) count value C1 indicates the number of sampling events in which a "1" SEN value is generated by sampling event circuit 133-2, and (second) count value Ct indicates the total number of sampling events. That is, detection counter 134-1 is configured to generate count value C1 such that is only incrementally increases in response to each sampling event in which periodic signal PS is determined to be in the asserted state. For example, when the asserted state detected during a given sampling event, the resulting "1" value of sampling event detection signal SEN causes detection count 134-1 to increase count value C1 by one. Conversely, when the de-asserted state detected during a given sampling event, the resulting "0" value of sampling event detection signal SEN causes detection count 134-1 to maintain (not change) the count value C1. In contrast, sampling event counter 134-2 increases by one each sampling event whether the asserted state is detected or the de-asserted state is detected. At the end of each test period, the final count values C1 and Ct are transmitted to memory 131-1 (or directly off-chip), and counters 134-1 and 134-2 are reset to zero by way of control signal RST before a subsequent test period is started.

As mentioned above and illustrated in the simplified example shown in FIGS. 2(A) to 2(D), the sample timing schedule utilized by periodic signal measurement circuit 130 is determined by detecting a recurring "trigger" signal feature (e.g., the rising or falling edge) of a reference signal REF having a reference frequency $F_{REF}$ that is uncorrelated to the frequency of periodic signal PS. As illustrated below, by generating reference signal REF such that its reference frequency $F_{REF}$ is uncorrelated to periodic signal PS, the recurring signal features (in this case, rising signal edges) used to trigger (initiate) the sampling events are detected at sample times that coincide with essentially randomly occurring phases of the periodic signal PS, whereby each sampling event involves detecting the asserted/de-asserted state of the periodic signal PS at an associated essentially random phase.

Figure 2A:
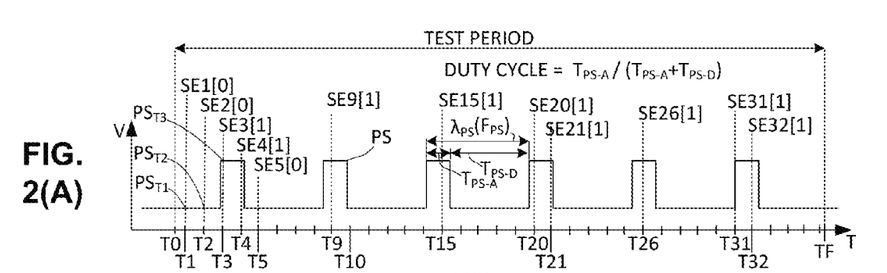
FIGS. 2(A), 2(B), 2(C) and 2(D) are timing diagrams depicting exemplary periodic and reference signals and associated count values generated during operation of the periodic signal measurement circuit of FIG. 1 according to an exemplary embodiment of the present invention.
Figure 2B:
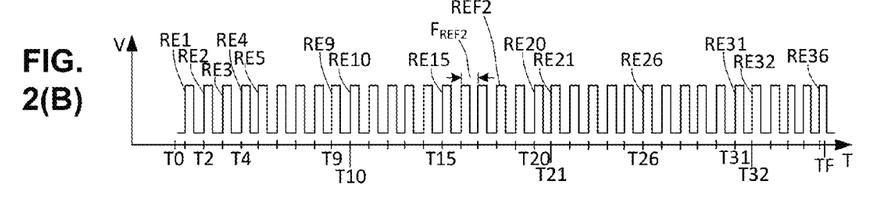

FIGS. 2(A) and 2(B) show timing diagrams including exemplary signals generated by periodic signal measurement circuit 130 (FIG. 1) during a greatly simplified exemplary test period, which occurs between an initial time T0 and a final time TF. FIG. 2(A) shows an exemplary periodic signal PS having a duty cycle (i.e., asserted time $T_{PS-A}$ divided by the signal period, which is the sum of asserted time $T_{PS-A}$ and de-asserted time $T_{PS-D}$) of approximately 25%, and an associated wavelength (and associated frequency) $\lambda_{PS}$ ($F_{PS}$) set such that periodic signal PS is repeated six times during the test period. For convenience, frequency, wavelength and cycle/period are sometimes utilized interchangeable herein. FIG. 2(B) shows an exemplary reference signal REF2 having a frequency $F_{REF2}$ set such that thirty-six cycles are executed during the test period. In this example, the rising edge of each cycle (pulse) is utilized as the recurring signal feature of reference signal REF2 that initiates (triggers) the sampling events performed by sample event circuit 133-2 (FIG. 1). As indicated in FIG. 2(B), because reference signal REF2 undergoes thirty-six cycles, thirty-six rising edges RE1 to RE36 are detected during the test period. Thus, as indicated in FIG. 2(A), the sample event circuit performs thirty-six sampling events SE1 to SE36 according to a sample timing schedule determined by rising edges RE1 to RE36.

Referring to FIG. 2(B), because the sample timing schedule (i.e., the timing of sampling events SE1 to SE24) is determined by rising edges RE1 to RE36 of reference signal REF2, and because the generation of reference signal REF2 is uncorrelated to the system clock signal (and, hence to periodic signal PS), reference frequency $F_{REF2}$ creates a sample timing schedule that is uncorrelated to periodic signal frequency $F_{PS}$, whereby each sampling event SE1 to SE24 occurs at a corresponding essentially random phase of periodic signal PS, whereby the probability of detecting an asserted state of periodic signal PS during any given sampling event SE1 to SE36 is proportional to the duty cycle of periodic signal PS. That is, after a start time T0, the first sampling event SE1 is performed upon detection of the first detected rising edge RE1 of reference signal REF2. As indicated in FIG. 2(A), first sampling event SE1 involves detecting the asserted/de-asserted state at a substantially instantaneous moment (time T1) that coincides with phase $PS_{T1}$ of periodic signal PS (i.e., at the point of the solid line representing periodic signal PS that is intersected by the vertical dashed line extending downward from "SE1" in FIG. 2(A)). Note that the test period is initiated without regard for the current phase of periodic signal T0, whereby one or both of start time T0 and rising edge RE1 at time T1 coincide with randomly occurring phases of periodic signal PS. Because sampling event SE1 involves sampling phase $PS_{T1}$ (i.e., while periodic signal PS is de-asserted), a corresponding sampling event detection signal value is generated for sampling event SE1 having a "0" value (which is indicated at the top of FIG. 2(A) as "SE1[0]"). Similarly, the next rising edge RE2 of reference signal REF2 triggers sampling event SE2 at time T2, which involves sampling phase $PS_{T2}$ (while periodic signal PS is still de-asserted), resulting in second sampling event SE2 also having a detection signal value of "0". At time T3, rising edge RE3 of reference signal REF2 triggers sampling event SE3, whereby phase $PS_{T3}$ is detected when periodic signal is asserted, resulting in sampling event SE3 having a detection signal value of "1" (which is indicated at the top of FIG. 2(A) as "SE3[1]"). Similarly, the next rising edge RE4 of reference signal REF4 triggers sampling event SE4 at time T4, which occurs while periodic signal PS is still asserted, resulting in another detection signal value of "1". Next, rising edge RE5 triggers sampling event SE5 at time T5 after periodic signal PS is again de-asserted, resulting in another "0" detection signal value. Sampling events then occur according to each rising edge of reference signal REF2, with sampling events SE9 (triggered by edge RE9 at time T9), SE15 (triggered by edge RE15 at time T15), SE21 and SE22 (triggered by edges RE21 and RE22 at times T21 and T22), SE26 (triggered by edge RE26 at time T26), and SE31 and SE32 (triggered by edges RE31 and RE32 at times T31 and T32) producing "1" detection signal values (i.e., due to the asserted state of the sampled periodic signal phases at those times), and all other sampling events producing "0" detection signal values.

Figure 2C:
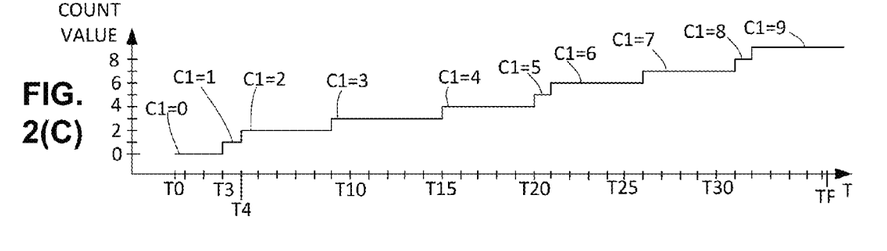
Figure 2D:
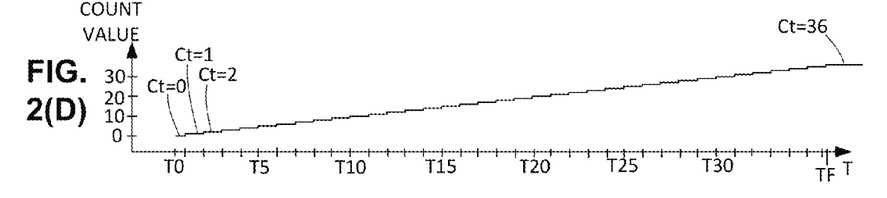

Referring to FIGS. 2(C) and 2(D), detection count value C1 and total event count value Ct are incremented in accordance with detected asserted states and the rising edges of reference signal REF2, respectively. For example, FIG. 2(C) shows that detection count value C1 starts with a "0" value at time T0, and remains at the "0" value until time T3, when it increases to a "1" value due to asserted state detected during sampling event SE3. Count value C1 then only incrementally increases with each successive detected asserted state (e.g., to "2" at time T4 in response to sampling event SE4, to "3" at time T9 in response to sampling event SE9, and then to "4", "5", "6", "7", "8" and "9" in response to sampling events SE15, SE20, SE22, SE26, SE31 and SE32, respectively). Again, note that count value C1 does not incrementally increase in response to sampling events in which a de-asserted state of periodic signal PS is detected. In contrast, FIG. 2(D) shows that event count value Ct starts with a "0" value at time T0, and increments after each sampling event such that, at time TF, event count value Ct includes (is equal to) the total number of sampling events occurring during the test period (i.e., in this example, thirty-six). At the end of the test period, the final value of detection value C1 (i.e., "9") and the final value of the total event count value Ct (i.e., "24") are transmitted to memory for further processing, and the count values are reset to zero.

As illustrated by the example shown in FIGS. 2(A) to 2(D), because each sampling event SE1 to SE36 is performed upon detection of a signal feature (i.e., rising edges RE1 to RE36) of reference signal REF2, and because reference frequency $F_{REF2}$ is uncorrelated to periodic signal PS, each rising edges RE1 to RE36 coincides with an essentially randomly occurring phase of the periodic signal PS, whereby the probability of detecting an asserted state during any given sampling event SE1 to SE36 is proportional to the duty cycle of periodic signal PS. Note that the exemplary example depicted in FIGS. 2(A) and 2(B) is greatly simplified for illustrative purposes, and is purposefully generated to produce a final count value ratio C1:Ct of 9:36 in order to correspond with the 25% duty cycle of periodic signal PS. By performing a sufficiently large number of sampling events (e.g., greater than approximately one million) in the manner described above with reference to FIGS. 2(A) to 2(D), a statistically relevant ratio (e.g., having an accuracy of +/−1% of an actual periodic signal's duty cycle) is generated during a corresponding test period. In a preferred embodiment, the statistics-based measurement methodology illustrated in FIGS. 2(A) to 2(D) is used to achieve picoseconds accuracy and resolution (i.e., greater than 99.99% by performing approximately one billion or more sampling events during each test period.

Figure 3A:
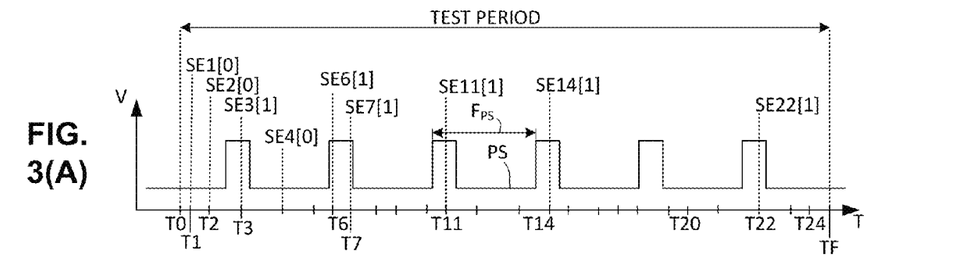
FIGS. 3(A), 3(B), 3(C) and 3(D) are timing diagrams depicting exemplary periodic and reference signals and associated count values generated during operation of the periodic signal measurement circuit of FIG. 1 according to another exemplary embodiment of the present invention.
Figure 3B:
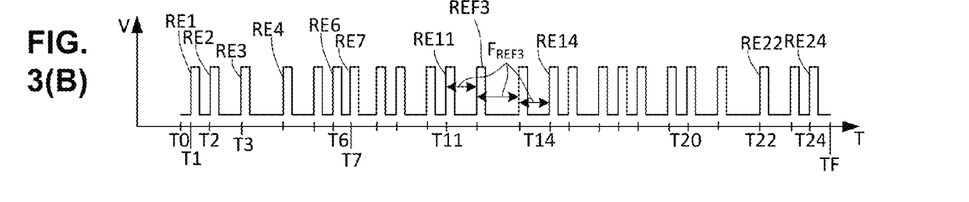
Figure 3C:
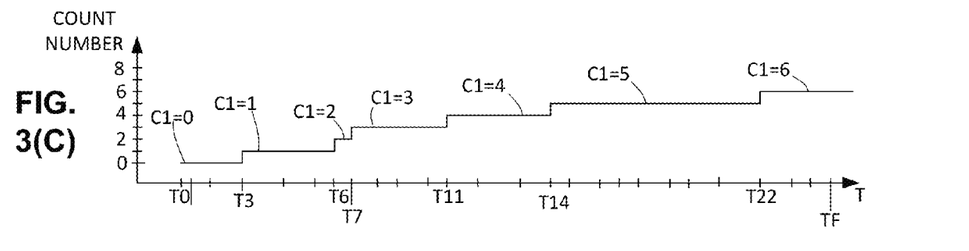
Figure 3D:
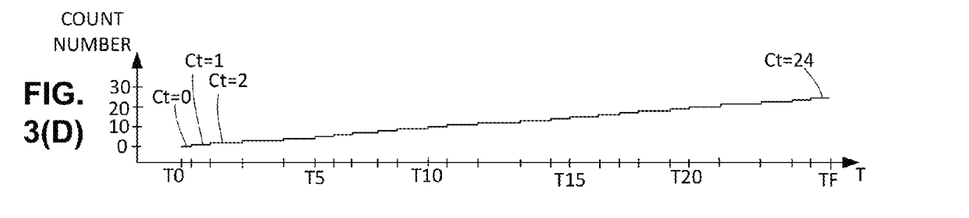

FIGS. 3(A) to 3(D) illustrate a second statistics-based measurement operation according to another exemplary embodiment in which a periodic signal in measured by the statistics-based measurement methodology of the present invention using a reference signal REF3 freely floats in accordance with changes in environment conditions. As indicated in FIG. 3(A), periodic signal PS is identical to that utilized and described above with reference to FIG. 2(A), and test period similarly extends between time T0 and TF, which correspond in real time to the example described above. However, FIG. 3(B) shows a reference signal REF3 that differs from the reference signal of the previous example in that its frequency $F_{REF3}$ freely floats or otherwise changes over time (as depicted by the three different-length doublearrow lines). Note that the changing signal frequency of reference signal REF3 generates a lower number of pulses during the test period time (i.e., twenty-four pulses between times T0 and TF), whereby only twenty-four rising edges RE1 to RE24 are generated during the test period that trigger twenty-four corresponding sampling events, which are indicated in FIG. 3(A) by vertical dashed lines SE1 to SE24.

Referring to FIGS. 3(A) and 3(B), similar to the example described above with reference to FIGS. 2(A) and 2(B), initial sampling events SE1 and SE2 are performed upon detection of rising edges RE1 and RE2 of reference signal REF3 at times T1 and T2, triggering successive sampling events SE1 and SE2 that detect a de-asserted state at associated phases of periodic signal PS, thus generating sampling event detection signal values "0". At time T3, rising edge RE3 triggers sampling event SE3 when periodic signal PS is asserted, resulting in sampling event SE3 having a detection signal value of "1". Next, rising edge RE4 triggers sampling event SE4 at time T4 after periodic signal PS is again de-asserted, resulting in another "0" detection signal value. Subsequently, asserted signal detections occur in sampling events SE6, SE7, SE11, SE14 and SE22 in response to rising edges RE6, RE7, RE11, RE14 and RE22 at times T6, T7, T11, T14 and T22. Referring to FIGS. 2(C) and 2(D), detection count value C1 incrementally increases from a reset "0" value to "6" in response to each detected asserted state of periodic signal PS associated with sampling events SE3, SE6, SE7, SE11, SE14 and SE22, and event count value Ct increments from "0" to "24".

Although greatly simplified and biased for descriptive purposes, the exemplary example depicted in FIGS. 3(A) to 3(D) illustrates two key points. First, even though a lower number of sampling events are performed during the test period, the final count value ratio C1:Ct of 6:24 accurately predicts the actual 25% duty cycle of periodic signal PS, illustrating that utilizing different numbers of sampling events during a given test period can generate similar results, provided each of the different numbers of sampling events is statistically significant, although statistical theory teaches that a higher number of sampling events generates more accurate results. In addition, the exemplary example depicted in FIGS. 3(A) to 3(D) illustrates that allowing the applied reference frequency to freely float or otherwise change during the test period has no significant effect on the measurement results because, as in the previous example, each sampling event involves detecting an essentially random phase of periodic signal PS. This feature is important because it means that low-cost frequency signal generator circuits, such as ring oscillators (which are known to generate signals whose frequencies freely float in accordance with changes to device temperature) may be utilized, for example, to implement on-chip reference signal generator 132-1 in periodic signal measurement circuit 130 (FIG. 1) without risking measurement accuracy.

According to another beneficial aspect of the present invention, because the measurement data is generated by sampling random periodic signal phases, the statistics-based measurement methodology of the present invention generates accurate measurement data whether the reference signal frequency is higher than the measured periodic signal frequency (e.g., as illustrated by the examples of FIGS. 2(A) and 2(B), wherein reference signal REF2 cycles through thirty-six pulses while periodic signal PS executes only six cycles), or whether the reference signal frequency is lower than the measured periodic signal frequency, as described below with reference to the exemplary embodiment illustrated in FIGS. 4(A) to 4(D).

Figure 4A:
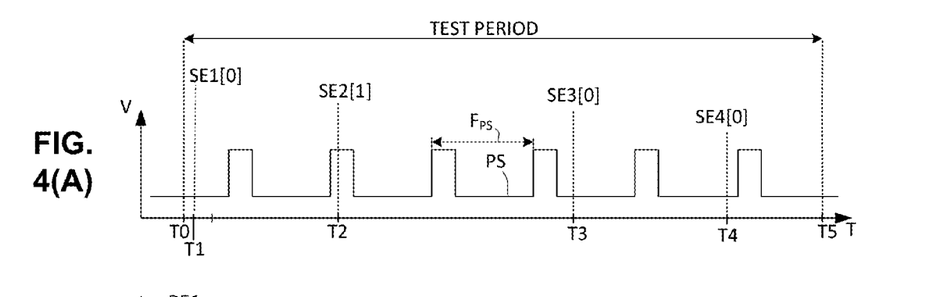
FIGS. 4(A), 4(B), 4(C) and 4(D) are timing diagrams depicting exemplary periodic and reference signals and associated count values generated during operation of the periodic signal measurement circuit of FIG. 1 according to another exemplary embodiment of the present invention.
Figure 4B:
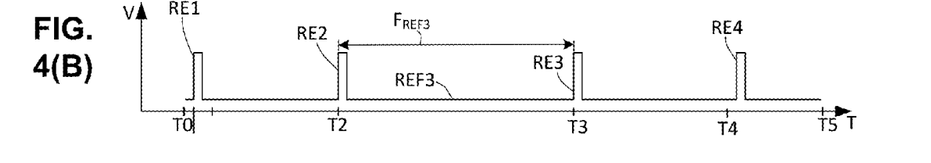
Figure 4C:
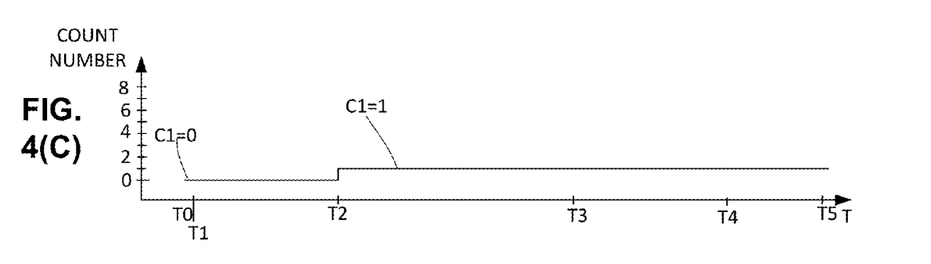
Figure 4D:
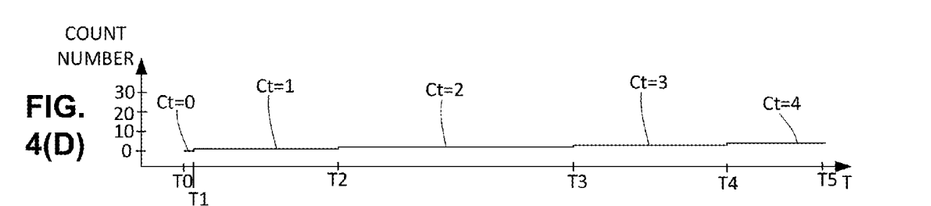

FIGS. 4(A) to 4(D) illustrate a third statistics-based measurement operation in which periodic signal PS in measured using a reference signal REF4 having a frequency $F_{REF4}$ that is lower than frequency $F_{PS}$. As indicated in FIG. 4(A), periodic signal PS goes through six cycles during the test period (between time T0 and TF) as in the examples described above. FIG. 4(B) shows reference signal REF4 having a frequency $F_{REF4}$ that produces only four pulses (cycles) during the test period. Sampling event SE1 is performed upon detection of rising edges RE1 of reference signal REF4 at times T1, whereupon the de-asserted state of an associated coincident phase of periodic signal PS is detected, thus generating sampling event detection signal value "0". At time T2, rising edge RE2 triggers sampling event SE2 when periodic signal PS is asserted, resulting in sampling event SE2 having a detection signal value of "1". Next, rising edge RE3 triggers sampling event SE3 at time T3 when periodic signal PS is again de-asserted, resulting in another "0" detection signal value. Finally, rising edge RE4 triggers sampling event SE4 at time T4 when periodic signal PS is also de-asserted, resulting in another "0" detection signal value. Referring to FIGS. 4(C) and 4(D), detection count value C1 increases from a reset "0" value to "1" in response to the only detected asserted state of periodic signal PS associated with sampling event SE2, and event count value Ct increments from "0" to "4" in accordance with the four pulses of reference signal REF4 occurring during the test period.

The example of FIGS. 4(A) to 4(D) illustrates an important advantage of the present invention. Namely, because the sample timing is uncorrelated to the periodic signal such each sampling event involves detecting a randomly selected/assigned phase, and because the final measurement data is determined by a ratio of detected asserted states to total sampling events, the statistics-based measurement methodology produces essentially identical measurement results whether the reference signal frequency is higher or lower than the measured periodic signal frequency. That is, like the 9:36 (25%) ratio generated in the example of FIGS. 2(A) to 2(D), and the 6:24 (25%) ratio generated in the example of FIGS. 3(A) to 3(D), the example of FIGS. 4(A) to 4(D) generate a 1:4 (25%) ratio even though only four sampling events take place during the test period. Of course, in order for the same statistically relevant results to be obtained, the example shown in FIGS. 4(A) to 4(D) would have to be performed for a much longer test period than that required for the example illustrated in FIGS. 2(A) to 2(D). However, the example shown in FIGS. 4(A) to 4(D) illustrates that, unlike conventional measurement approaches that require a higher frequency reference signal than that of the measured periodic signal, the reference signal frequency utilized by the present invention is entirely independent from the periodic signal frequency, which means that a single reference signal generator (e.g., a 1 GHz ring oscillator) can be utilized to measure multiple periodic signals having a wide range of periodic signal frequencies (e.g., 0.5 GHz, 5 GHz or 50 GHz). This feature provides an additional advantage over conventional approaches because an identical periodic signal measurement circuit can be implemented (i.e., fabricated onto) a wide range of different IC devices having wide range of different operating speeds.

The present invention will now be described with reference to certain specific embodiments illustrated in FIGS. 5 to 9.

Figure 5:
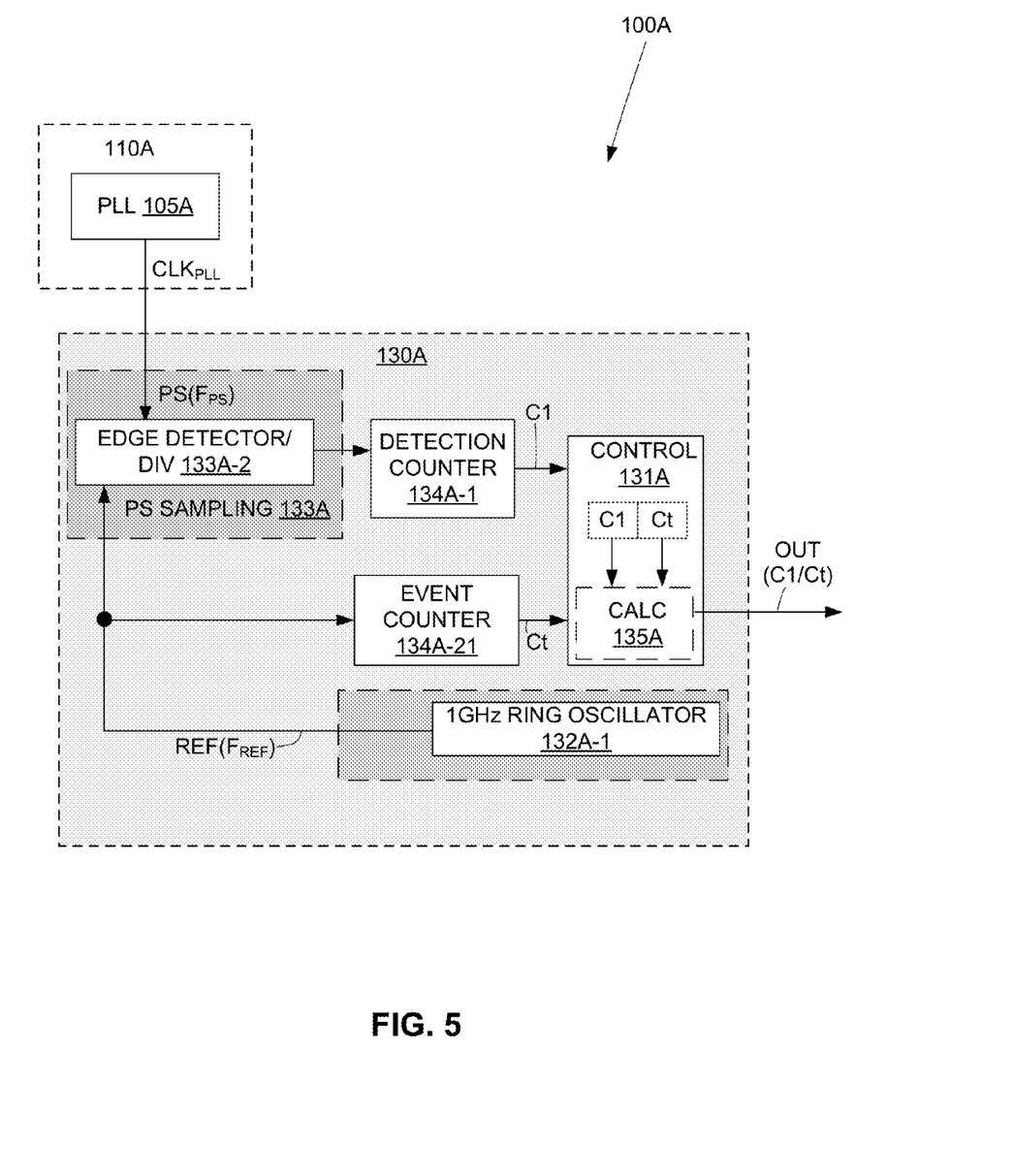
FIG. 5 is a simplified diagram showing an IC device including a periodic signal measurement circuit according to an exemplary specific embodiment of the present invention.

FIG. 5 shows a simplified IC device 100A including a periodic signal measurement circuit 130A according to a first exemplary specific embodiment. As in the generalized embodiment of FIG. 1, IC device 100A includes a functional circuit 110A including a PLL circuit 105A and other circuitry (not shown) that operates using a PLL clock signal $CLK_{PLL}$ generated by PLL circuit 105A. In the present simplified embodiment, periodic signal measurement circuit 130A is configured to facilitate on-chip measurement of pulse width (duty cycle) of PLL clock signal $CLK_{PLL}$ to verify, e.g., that it is generated with a required pulse width. That is, in this embodiment, PLL clock signal $CLK_{PLL}$ becomes periodic signal PS having frequency $F_{PS}$ that is processed by sampling circuit 133A in conjunction with reference signal REF, which in this embodiment is generated by a 1 GHz ring oscillator (reference signal generator) 132A-1. Also in accordance with the present embodiment, sampling circuit 133A includes an edge detector (sampling circuit) 133A-2 that triggers sampling events in accordance with reference signal REF in a manner similar to that described in any of the examples provided above. As in the previous embodiments, a detection counter 134-1 is controlled by sampling circuit 133A to generate a detection count value C1, and an event counter 134A-2 generates total event count value Ct during each test period. Control circuit 131A includes an optional on-chip calculator 135A that performs an on-chip calculation of the duty cycle of the PLL clock signal $CLK_{PLL}$ by generating a ratio of count value C1 to count value Ct. Other optional circuitry, such as divider circuits, may be also be utilized.

According to another exemplary embodiment of the present invention, a method is provided for measuring clock-to-output (Tcq) memory access delay times (i.e., the delay between the starting edge of the memory read operation to the memory read data output) exhibited by an embedded memory circuit on a SoC or other IC device in order to verify that the actual memory access delay time meets predetermined timing requirements (i.e., to verify that the embedded memory circuit operates at a required speed on a fabricated IC device). As set forth below, the Tcq measurement methodology includes both the process of generating a delay pulse signal whose duty cycle that provides valuable Tcq measurement data, and the measurement process utilized to measure the delay pulse signal. Although the specific embodiments that describe the Tcq measurement methodology below with reference to FIGS. 6 and 7 utilize the statistics-based measurement methodology described above to measure the delay pulse signal, it is understood that the process of generating a delay pulse signal is currently considered novel by itself, and that other duty cycle or pulse width measurement techniques may be utilized to perform measurement of the delay pulse signal generated in the manner described below.

Figure 6:
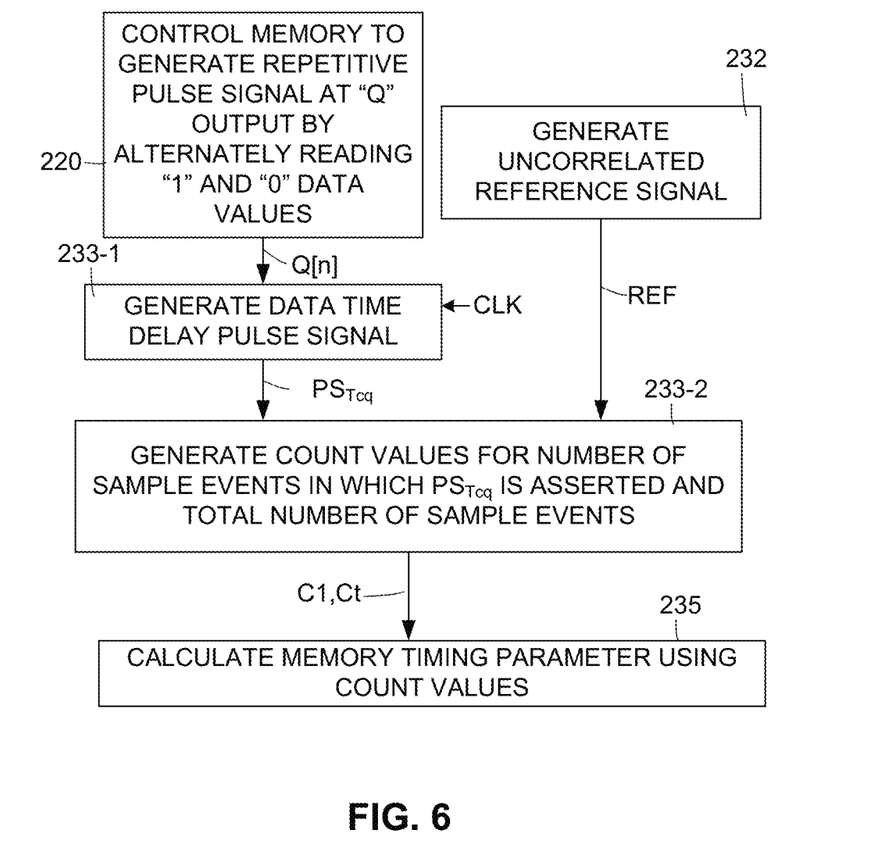
FIG. 6 is a simplified flow diagram showing a statistical measurement methodology for measuring the clock-to-output delay of an embedded memory circuit according to another embodiment of the present invention.

FIG. 6 is a flow diagram illustrating a generalized methodology for measuring Tcq memory access delay times using the statistical signal measurement methodology according to another specific embodiment of the present invention. The methodology includes (block 220) controlling (e.g., using a memory BIST processor) an embedded memory circuit to generate a repetitive pulse signal Q[n] by way of initializing the memory with alternating data and constantly reading out the data, thus generating repetitive pulse signal Q[n] with alternating "1" and "0" data bit values from the memory output terminals. Referring to block 233-1, the repetitive pulse signal signal generated by the embedded memory circuit is then processed using the system clock signal and logic circuitry to generating a data time delay pulse signal $PS_{Tcq}$ whose duty cycle indicates the Tcq memory access delay time exhibited by the embedded memory circuit. In a specific embodiment, delay pulse signal $PS_{TCQ}$ is generated by applying repetitive pulse signal Q[n] and a system clock signal CLK to the input terminals of an exclusive-OR (XOR) circuit, whereby the XOR output signal includes a delay pulse signal whose duty cycle value corresponds to the desired Tcq memory access delay time (plus a clock divider flop delay time). The remainder of the flow diagram in FIG. 6 illustrates measurement of the delay pulse signal $PS_{TCQ}$ using the statistics-based measurement methodology described above. Block 232 illustrates generating an uncorrelated reference signal REF having the characteristics described above. Block 233-2 depicts utilizing uncorrelated reference signal REF to generate detection count value C1 and event count value Ct in the manner described above, and block 235 depicts calculating (computing) one or more memory timing parameters (e.g., the Tcq memory access delay time) using count values C1 and Ct.

Figure 7:
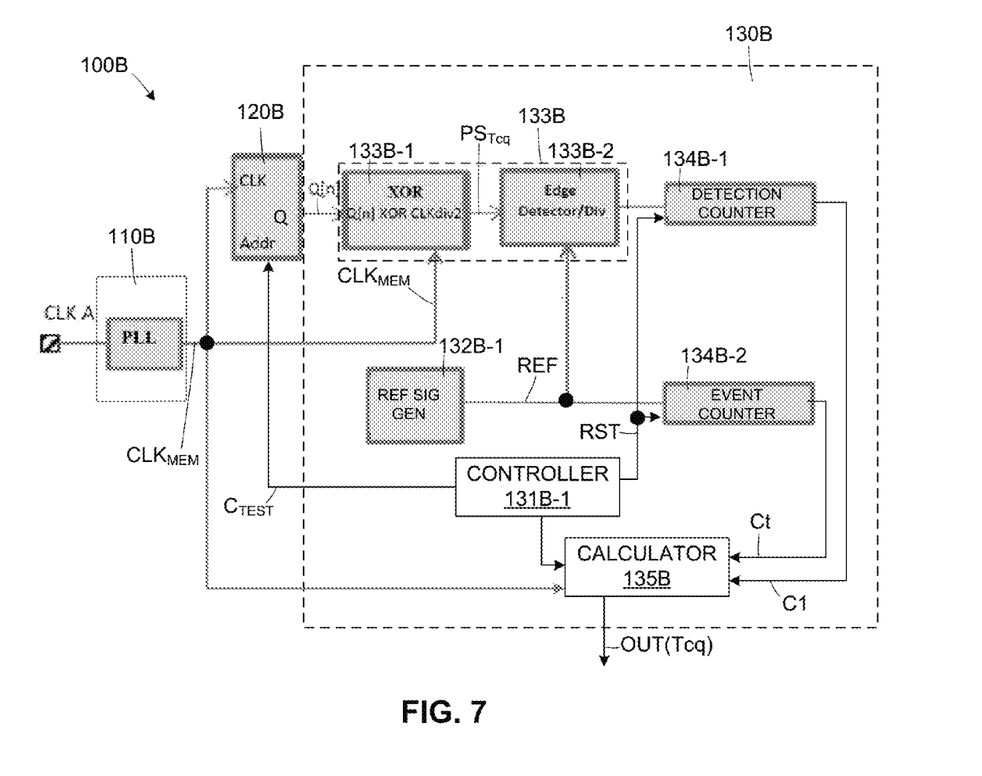
FIG. 7 is a simplified diagram showing an IC device including a periodic signal measurement circuit according to another exemplary embodiment of the present invention.
Figures 8A, 8D:
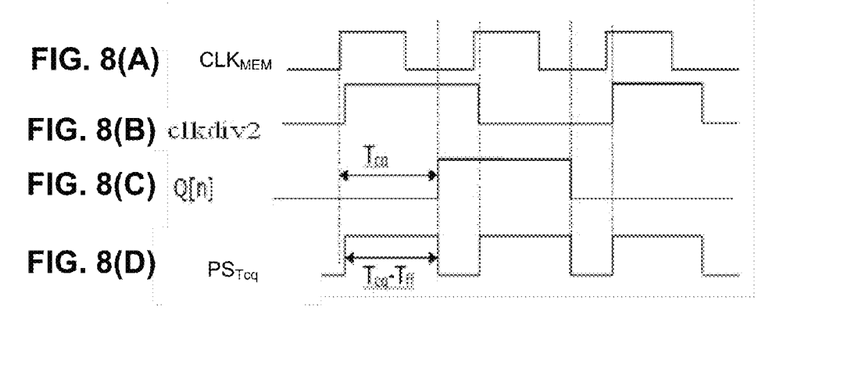

FIG. 7 shows a simplified IC device 100B including a periodic signal measurement circuit 130B according to a second exemplary specific embodiment, and FIGS. 8(A) to 8(D) are signal diagrams depicting exemplary signals generated by IC device 100B during operation. As in the embodiments described above, IC device 100B includes a functional circuit 110B including a PLL circuit 105B and other circuitry (not shown), PLL circuit 105B generates a PLL clock signal $CLK_{MEM}$ (shown in FIG. 8(A)) that is utilized to control the operation of an embedded memory circuit 120B. In the present simplified embodiment, periodic signal measurement circuit 130B is configured to facilitate measuring Tcq memory access delay times exhibited by embedded memory circuit 120B using the statistical signal measurement methodology according to another specific embodiment of the present invention. A controller (first-sub circuit) 131B-1 serves to control memory circuit 120B such that repetitive "1" and "0" bit patterns are generated as a repetitive pulse signal Q[n] on an output terminal Q of the memory circuit 120B, whereby repetitive pulse signal Q[n] (shown in FIG. 8(C)) is transmitted to sampling circuit 133B. As in previous embodiments, sampling circuit 133B is configured to repeatedly detect a recurring trigger signal feature (e.g., rising edge RE) of reference signal REF, and to perform multiple sampling events on a periodic signal at respective sample times determined by sequential detections of the recurring trigger signal feature. However, unlike previous embodiments, the periodic signal measured by sampling circuit 133B is not generated directly by functional circuit 110B or memory circuit 120B (i.e., sampling circuit 133B does not measure repetitive pulse signal Q[n]). Instead, sampling circuit 133B includes a processing block 133B-1 processes repetitive pulse signal Q[n] using clock signal $CLK_{MEM}$ to generate a data time delay pulse signal $PS_{Tcq}$, and then sampling circuit 133B utilizes a sample event circuit 133B-2 to perform the sampling events in accordance with sample timing set by reference signal REF, which is generated by a reference signal generator 132B-1 (e.g., a random clock generator). In the exemplary specific embodiment, processing block 133B-1 divides clock signal $CLK_{MEM}$ by two to generate a CLKdiv2 signal (shown in FIG. 8(B)), and then to XOR the repetitive pulse signal Q[n] and the CLKdiv2 signal to generate a data time delay pulse signal $PS_{Tcq}$ (shown in FIG. 8(D)). Data time delay pulse signal $PS_{Tcq}$ is then passed from processing block 133B-1 to sample event circuit 133B-2 for measurement using the statistics-based measurement methodology described above. The two resulting count values C1 and Ct respectively generated by detection counter 134B-1 and event counter 134B-2 are passed to a calculator circuit 135B, which processes the count values using methods similar to those mentioned above to provide a statistical measurement of the Tcq data delay time exhibited by embedded memory circuit 120B. Specifically, the exact pulse width of the Tcq data delay time is calculated based on correlation of the two counter values and the frequency of the pulse. For example, the exact pulse width is calculated multiplying the detection count value C1 with the system clock signal period ($T_{CLKPLL}$), dividing that product by the second count value Ct, and then adding a clock divider flop delay time ($T_{ff}$; i.e., the delay value of the clock divider flip-flop obtained from a standard cells library characterization number, or an actual clock divider flip-flop delay value measured on-chip after fabrication). By utilizing this modified methodology, the present invention facilitates on-chip fully-digital measurement of data delay times from memory clock to memory output Tcq without requiring the extensive calibration needed with conventional approaches.

Figure 9:
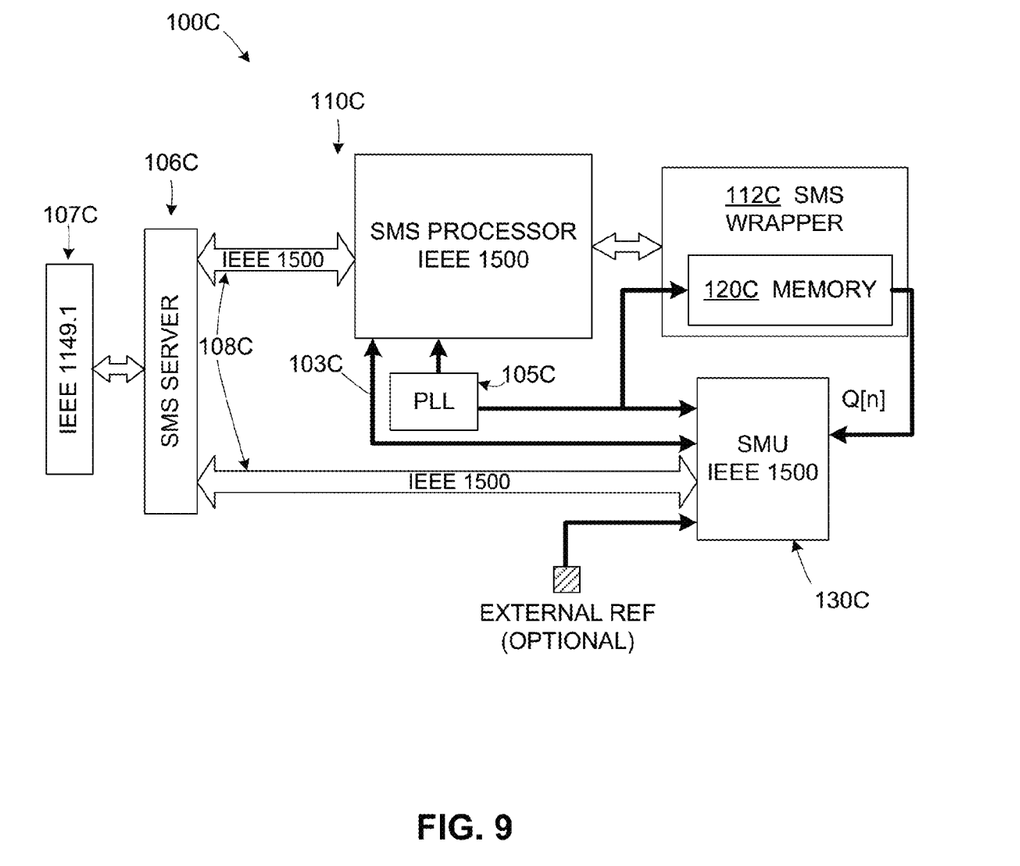
FIG. 9 is a simplified diagram showing an IC device including a periodic signal measurement circuit according to another exemplary embodiment of the present invention.

FIG. 9 is a simplified diagram showing an IC device 100C including functional circuit 110C, an embedded memory 120C and a periodic signal measurement circuit 130C according to another exemplary embodiment of the present invention. Functional circuitry 110C includes a device processor 111C that communicates with periodic signal measurement circuit 130C by way of a bus 103C to facilitate multiple periodic signal measurements and associated analyses. In one operating mode device processor 111C configures and controls an embedded memory circuit 120C by way of an SMS wrapper circuit 112C to generate repetitive "1" and "0" output values Q[n] in order to facilitate Tcq delay time measurements using periodic signal measurement circuit 130C according to the methodology discussed above. In another operating mode, device processor 111C coordinates with periodic signal measurement circuit 130C to analyze a clock signal $CLK_{PLL}$ generated by one or more PLL circuits 105C. The IC device 100C also includes communication circuitry (e.g., and SMS server 106C and I/O circuitry 107C and associated communication busses 108C) configured to facilitate communicating with off-chip test equipment. With this arrangement, IC device 100C is configured to coordinate the operations of periodic signal measurement circuit 130B in order to facilitates post-production periodic self-test procedures that may be used to detect impending circuit failures, e.g., by way of periodically measuring and recording critical signals generated by functional circuitry 110C and/or embedded memory circuit 120C, whereby potential problems might be detected by way of changes to these critical signals over time.

Although the present invention has been described with respect to certain specific embodiments, it will be clear to those skilled in the art that the inventive features of the present invention are applicable to other embodiments as well, all of which are intended to fall within the scope of the present invention.

The invention claimed is:

1. A method for performing analysis of a periodic signal having an associated duty cycle that is generated in accordance with operations of at least one of a functional circuit and an embedded memory circuit, the method comprising:
    performing multiple sampling events during a test period according to a sample timing schedule determined by repeatedly detecting a recurring signal feature of a reference signal, wherein each sampling event of said multiple sampling events includes determining an asserted/de-asserted state of an associated signal phase of said periodic signal occurring at an associated sample time determined by detecting an associated said recurring signal feature, and wherein the reference signal has a reference frequency that is uncorrelated to the periodic signal such that each recurring signal feature of said reference signal coincides in time with a substantially random signal phase of said periodic signal, whereby a probability of detecting an asserted state during any given said sampling event is proportional to the associated duty cycle of the periodic signal;
    generating a first count value such that said first count value only incrementally increases in response to each said sampling event occurring during said test period in which said periodic signal is in said asserted state; and
    generating a second count value including a total number of said plurality of sampling events performed during said test period,
    wherein performing said multiple sampling events comprises performing a statistically significant number of said multiple sampling events during said test period such that a ratio of said first count value to said second count value at an end of said test period provides a statistically relevant measurement value of said associated duty cycle of the periodic signal.

2. The method of claim 1, further comprising generating said reference signal utilizing a reference signal generator circuit configured such that said reference frequency freely floats in accordance with changes in environment conditions of said reference signal generator circuit.

3. The method of claim 1, wherein generating said reference signal comprises utilizing a ring oscillator configured such that said reference frequency changes in accordance with a temperature of said ring oscillator.

4. The method of claim 1, wherein performing said plurality of sampling events comprises initiating each said sampling event upon detecting an associated edge of said reference signal.

5. The method of claim 1, further comprising at least one of storing said first count value and said second count value in memory that is co-disposed on a semiconductor substrate with said at least one of said functional circuit and said embedded memory circuit, and performing on-chip calculation of said ratio using calculating circuitry that is co-disposed on said semiconductor substrate with said at least one of said functional circuit and said embedded memory circuit.

6. The method of claim 5, further comprising utilizing said calculated ratio of said first count value to said second count value to perform at least one of a phase-locked loop (PLL) clock frequency measurement, an embedded memory delay measurement, a delay corner evaluation, and a process variation evaluation.

7. The method of claim 1, wherein performing said on-chip analysis comprises:
    controlling said embedded memory circuit using a clock signal to generate a repetitive pulse signal by reading alternating "1" and "0" data bit values from memory cells of the embedded memory circuit such that said repetitive pulse signal has a frequency determined by a memory access rate of the embedded memory circuit;
    generating a data time delay pulse signal using the repetitive pulse signal and the clock signal;
    generating said first count value using said reference signal and said data time delay pulse signal; and
    after said test period, calculating a clock-to-output memory access delay time value using the first and second count values.

8. The method of claim 7, wherein controlling the embedded memory circuit to generate said repetitive pulse signal comprises:
   writing a bit pattern into said embedded memory circuit such that each memory cell having an even-numbered memory address stores a "0" bit value, and each memory cell having an odd-numbered memory address stores a "1" bit value; and
   reading the bit pattern from the embedded memory circuit by operating the embedded memory circuit in a continuous read operating mode.

9. The method of claim 7, wherein controlling the embedded memory circuit to generate said repetitive pulse signal comprises:
   writing a "0" bit value into a first memory cell and a "1" bit value into a second memory cell; and
   repeatedly alternately reading the first and second memory cells.

10. The method of claim 7, wherein generating the data time delay pulse signal comprises dividing the clock signal by two to generate a half-clock signal, and exclusive-ORing the repetitive pulse signal and the half-clock signal to generate the data time delay pulse signal.

11. The method of claim 7, wherein calculating the data delay time from memory clock to memory output comprises multiplying the first count value with a period of said periodic signal, dividing by said second count value, and then adding a clock divider flop delay time.

12. An integrated circuit (IC) device comprising:
   at least one of a functional circuit and an embedded memory circuit fabricated on a semiconductor substrate and configured to operate in accordance with a system clock signal having a system clock frequency; and
   a periodic signal measurement circuit fabricated on the semiconductor substrate and configured to analyze, during a test period, a periodic signal having an associated duty cycle and is generated in accordance with operations of said at least one of said functional circuit and said embedded memory circuit, said periodic signal measurement circuit including:
      a reference signal generator configured to generate a reference signal such that a reference frequency of the reference signal is uncorrelated to the periodic signal;
      a sampling circuit configured to repeatedly detect a recurring signal feature of said reference signal, and to perform multiple sampling events at respective sample times determined by sequential detections of said recurring signal feature, wherein each sampling event of said multiple sampling events includes determining an asserted/de-asserted state of an associated signal phase of said periodic signal occurring at an associated sample time of said respective sample times determined by a detection of an associated recurring signal feature such that a probability of detecting an asserted state during any given said sampling event is proportional to the associated duty cycle of the periodic signal;
      a detection counter configured to generate a first count value such that said first count value only incrementally increases in response to each said sampling event occurring during said test period in which said periodic signal is determined to be in said asserted state;
      a sampling event counter configured to generate a second count value such that said second count value incrementally increases in response to every said sampling event occurring during said test period; and
      a control circuit configured to control said detection counter and said sampling event counter such that a statistically significant number of said multiple sampling events are performed during said test period such that a ratio of said first count value to said second count value at an end of said test period provides a statistically relevant measurement value of said associated duty cycle of the periodic signal.

13. The IC device of claim 12, wherein the reference signal generator is configured to generate said reference signal such that said reference frequency freely changes in accordance with changes in device operating environment conditions of said IC device.

14. The IC device of claim 13, wherein the reference signal generator comprises a ring oscillator configured such that the reference frequency freely changes over time in response to changes in operating temperature of said ring oscillator.

15. The IC device of claim 12, wherein said sampling circuit comprises an edge detector configured to detect at least one of each rising edge and each falling edge of said reference signal, wherein said associated sample time of each said sampling event is determined by an associated said detected at least one of each rising edge and each falling edge of said reference signal.

16. The IC device of claim 12, wherein said control circuit is configured to calculate at least one of a duty cycle, a frequency, and a pulse width of said periodic signal using a ratio of said first count value to said second count value.

17. The IC device of claim 16,
   wherein said functional circuit comprises a phase-locked loop (PLL) circuit configured to generate a PLL clock signal, and
   wherein said periodic signal measurement circuit is configured to calculate said at least one of said duty cycle, said frequency, and said pulse width of said PLL clock signal.

18. The IC device of claim 12, further comprising means for controlling said embedded memory circuit such that said embedded memory circuit generates a repetitive pulse signal by reading alternating "1" and "0" data bit values from memory cells of said embedded memory circuit such that said repetitive pulse signal has a frequency determined by a memory access rate of the embedded memory circuit,
   wherein said periodic signal measurement circuit is configured to analyze said repetitive pulse signal.

19. The IC device of claim 18,
   wherein the sampling circuit comprises:
      a logic circuit configured to generate a data time delay pulse signal using the repetitive pulse signal and the system clock signal; and
      a detection circuit configured to generate said first count value using said reference signal and said data time delay pulse signal,
   wherein the periodic signal measurement circuit further comprises a calculation circuit configured to calculate a clock-to-output memory access delay time value after said test period using the first and second count values.

\* \* \* \* \*